(12) United States Patent
Song et al.

(10) Patent No.: US 12,115,885 B2
(45) Date of Patent: Oct. 15, 2024

(54) CAPACITIVE TOUCH-TYPE POWER SEAT SWITCH USING RECEPTACLE

(71) Applicants: HYUNDAI TRANSYS INC., Seosan-si (KR); DUCK IL INDUSTRY CO. LTD, Pyeongtaek-si (KR)

(72) Inventors: Hyun Seok Song, Hwaseong-si (KR); Beom Sun Kim, Hwaseong-si (KR); Tae Hyoung Yang, Hwaseong-si (KR); Seung Kyu Lee, Hwaseong-si (KR); Byeong Wook Kim, Hwaseong-si (KR)

(73) Assignees: HYUNDAI TRANSYS INC., Seonsan-si (KR); DUCK IL INDUSTRY CO., LTD., Pyeongtaek-si (KR)

( * ) Notice: Subject to any disclaimer, the term of this patent is extended or adjusted under 35 U.S.C. 154(b) by 139 days.

(21) Appl. No.: 17/815,425

(22) Filed: Jul. 27, 2022

(65) Prior Publication Data

US 2023/0049847 A1 Feb. 16, 2023

(30) Foreign Application Priority Data

Aug. 11, 2021 (KR) .......................... 10-2021-0106097

(51) Int. Cl.
*H03K 17/955* (2006.01)
*B60N 2/02* (2006.01)

(52) U.S. Cl.
CPC .................................. *B60N 2/0228* (2013.01)

(58) Field of Classification Search
CPC .... B60N 2/0228; B60N 2/0244; B60N 2/002; B60N 2/02246; B60N 2/0256;
(Continued)

(56) References Cited

U.S. PATENT DOCUMENTS

2008/0169936 A1    7/2008  Pickering et al.
2010/0066137 A1*   3/2010  Sakai ................... B60N 2/0244
                                                    297/217.3
(Continued)

FOREIGN PATENT DOCUMENTS

EP    2163420 A2    3/2010
EP    3783802 A2    2/2021
(Continued)

OTHER PUBLICATIONS

Korean Application No. 10-2021-0106097 Written Decision on Registration dated Feb. 1, 2023.
(Continued)

*Primary Examiner* — Ahmed M Saeed
(74) *Attorney, Agent, or Firm* — Frank Gao, Esq.

(57) ABSTRACT

The present disclosure relates to a capacitive touch-type power seat switch using a receptacle, mounted on a seat of a vehicle and configured to control a position of the seat and a function thereof, the power seat switch comprising: a knob configured to be moved upwards, downwards, leftwards, and rightwards by operation of a user; an operation transmission unit configured to transmit an operation direction of the knob when the knob is moved upwards, downwards, leftwards, and rightwards, and to implement a function of the power seat switch in response to an operation signal according to the transmitted operation direction; a receptacle installed in a PCB provided in the operation transmission unit; a sensor electrode electrically connected to the receptacle and configured to detect variation in capacitance; and a sensor circuit part electrically connected to the sensor electrode.

5 Claims, 10 Drawing Sheets

(58) Field of Classification Search
CPC .......... B60N 2/0272; B60N 2/06; B60N 2/20; H01H 2300/008; H01H 25/002; H01H 2217/04; H01H 15/10; H01H 13/84; H01H 2231/026; H01H 2003/0293
See application file for complete search history.

(56) References Cited

U.S. PATENT DOCUMENTS

| | | | |
|---|---|---|---|
| 2017/0315722 A1* | 11/2017 | Yao | .................... G06F 3/04886 |
| 2020/0252063 A1 | 8/2020 | Mokuo et al. | |

FOREIGN PATENT DOCUMENTS

| | | | |
|---|---|---|---|
| JP | 2002144937 A | 5/2002 |
| KR | 100495901 B1 | 6/2005 |
| KR | 101011762 B1 | 2/2011 |
| KR | 20120065323 A | 6/2012 |
| KR | 101816684 B1 | 1/2018 |
| KR | 20190046215 A | 5/2019 |
| KR | 1020190057474 A | 5/2019 |

OTHER PUBLICATIONS

Korean Application No. 10-2021-0106097 Office Action dated Jan. 9, 2023.
European Application No. 22187480.3 Search Report and its opinion dated Dec. 14, 2022.

* cited by examiner

CAPACITIVE TOUCH-TYPE POWER SEAT SWITCH USING RECEPTACLE

This application claims the benefit of Korean Patent Application No. 10-2021-0106097, filed on Aug. 11, 2021, the entireties of which are incorporated herein by reference.

BACKGROUND

(a) Technical Field

The present disclosure relates to a capacitive touch-type power seat switch using a receptacle. More particularly, it relates to a capacitive touch-type power seat switch using a receptacle configured to detect a change in capacitance that occurs when a user attempts to operate the power seat switch and a human body or a specific object is located within a predetermined distance, and to confirm, in advance, a function of a seat to be adjusted when a knob is operated before the human body or the specific object contacts the power seat switch.

(b) Background Art

Recently, consumer demand for conveniences in vehicles has increased. Accordingly, an electric seat, which was applied only to luxury vehicles in the past, is also currently applied to standard vehicles and compact vehicles. In addition, the electric seat, which has conventionally been used for a driver's seat, is now also applied to a front passenger seat and second-row seats, and the range of use of electric seats in passenger compartments is gradually expanding. Further, electric seats are also increasingly common.

As the range of use of the electric seat expands and the frequency of use thereof increases, research and development on a switch for the electric seat has been actively conducted to improve the performance of the switch and the functionality thereof.

For example, KR 10-1816684 discloses "SWITCH DEVICE OF POWER SEAT FOR VEHICLE".

In the related art, a switch device of a power seat for a vehicle includes a base installed on a seat, the base having fixing protrusions spaced apart from each other by a predetermined distance in an outward direction of the seat and configured to protrude, and a lever installed so as to be slidable between the fixing protrusions spaced apart from each other so that a position of the seat is moved, configured to form locking protrusions protruding toward the base, each of which is provided at a corresponding one of opposite ends thereof, and to maintain movement of the seat in a direction in which the locking protrusion catches on the fixing protrusion when the lever slides and the locking protrusion catches on the fixing protrusion to be engaged therewith, wherein the fixing protrusion is made of an elastic material to be deformable, and the locking protrusion is made of a rigid material so as to deform the fixing protrusion and pass over the same when forcibly moved in a state of contacting the fixing protrusion. In the switch device of the power seat for the vehicle of the related art, an automatic mode is applied to switch operation so that a seat position can be adjusted precisely in a normal situation, and positional movement of the seat is automatically maintained when a user needs to adjust the seat position in a long section, thereby having an effect of improving convenience in using a seat.

However, in the related art, since it is difficult to visually distinguish which switch is operated when the switch is operated, there is a problem in that erroneous operation occurs and operation accuracy deteriorates in the dark. Further, a driver may drive distractedly when operating the seat while driving.

In addition, there is a problem in that convenience of operation of a power seat switch and accuracy of operation thereof deteriorate because a user is required to directly operate the power seat switch in order to identify the particular switch that the user intends to operate.

Therefore, it is necessary to develop technology enabling the operation state of the power seat switch to be visually checked, so that a user may check which switch is operated in the dark and may determine which switch is to be operated before actually operating the power seat switch.

The above information disclosed in this Background section is only for enhancement of understanding of the background of the invention, and therefore it may contain information that does not form the prior art that is already known in this country to a person of ordinary skill in the art.

SUMMARY OF THE DISCLOSURE

The present invention has been made in an effort to solve the above-described problems associated with the prior art, and it is an object of the present invention to provide a capacitive touch-type power seat switch using a receptacle configured to compare a reference capacitance value and a variable capacitance value, to output a detection signal to an AVN of a vehicle, and to confirm, in advance, the function that a user intends to use, thereby solving problems in which an operational error occurs in the dark, resulting in deterioration in operation accuracy, and in which a driver is distracted from driving when operating a seat while driving.

Further, a sensor electrode detects variation in capacitance that occurs when a human body or a specific object is located within a predetermined distance, and a sensor circuit part connected to the sensor electrode compares a detected variable capacitance value with a reference capacitance value. In this case, when the variable capacitance value is equal to or greater than the reference capacitance value, a detection signal is output and transmitted to the AVN of the vehicle, thereby making it possible to confirm, in advance, the function that a user intends to operate before the user directly touches the power seat switch. Accordingly, a user may determine the function that the user intends to perform without directly operating the power seat switch.

The objects of the present invention are not limited to the above-mentioned objects, and other technical objects not mentioned will be clearly understood by those skilled in the art from the detailed description of the embodiments.

In one aspect, the present invention provides a capacitive touch-type power seat switch using a receptacle, the power seat switch including a knob configured to be moved upwards, downwards, leftwards, and rightwards by operation of a user, an operation transmission unit configured to transmit an operation direction of the knob when the knob is moved upwards, downwards, leftwards, and rightwards and to implement a function of the power seat switch in response to an operation signal according to the transmitted operation direction, a receptacle installed in a PCB provided in the operation transmission unit, a sensor electrode electrically connected to the receptacle and configured to detect variation in capacitance, and a sensor circuit part electrically connected to the sensor electrode.

In a preferred embodiment, the operation transmission unit may include a power bezel installed below the knob, the power bezel having a pressing part formed thereon, a stainless steel plate made of a conductive material and installed below the power bezel, an upper cover installed below the stainless steel plate, the upper cover having a support part formed thereon, a slider installed below the upper cover and coupled to the knob to allow the knob to move upwards, downwards, leftwards, and rightwards, a lower cover installed below the slider and coupled to the upper cover to form a space configured to enable the slider to slide therein, a plurality of plungers installed below the lower cover and configured to transmit the operation direction of the knob by movement of the slider, and an elastic pad installed below the plurality of plungers and configured to transmit the operation direction of the knob transmitted by vertical movement of the plurality of plungers through direct contact therewith.

In another preferred embodiment, the stainless steel plate may include an upper plate having a pair of through-holes formed therein, an extension part formed at one end of the upper plate, and a bent end bent downwards from one side of the extension part. Here, the bent end may include an upper surface part having a large width and a connection part having a small width.

In still another preferred embodiment, the stainless steel plate may be installed between the pressing part of the power bezel and the support part of the upper cover, thereby allowing the sensor electrode to accurately detect a variable capacitance value.

In yet another preferred embodiment, the slider may include a bottom plate formed by cutting a lower portion thereof in a V-shape so that the plunger is in close contact therewith, and a pair of operation levers formed to be spaced apart from each other by a predetermined gap and located at an upper portion of the bottom plate.

In still yet another preferred embodiment, the sensor circuit part may include a comparator configured to receive a reference capacitance value through one side thereof and to receive a variable capacitance value from the sensor electrode through the other side thereof, and the comparator may compare the variable capacitance value with the reference capacitance value and may output a detection signal when the variable capacitance value is equal to or greater than the reference capacitance value.

Other aspects and preferred embodiments of the invention are discussed infra.

The above and other features of the invention are discussed infra.

BRIEF DESCRIPTION OF THE DRAWINGS

The above and other features of the present invention will now be described in detail with reference to certain exemplary embodiments thereof illustrated in the accompanying drawings which are given hereinbelow by way of illustration only, and thus are not limitative of the present invention, and wherein.

Figure 1:
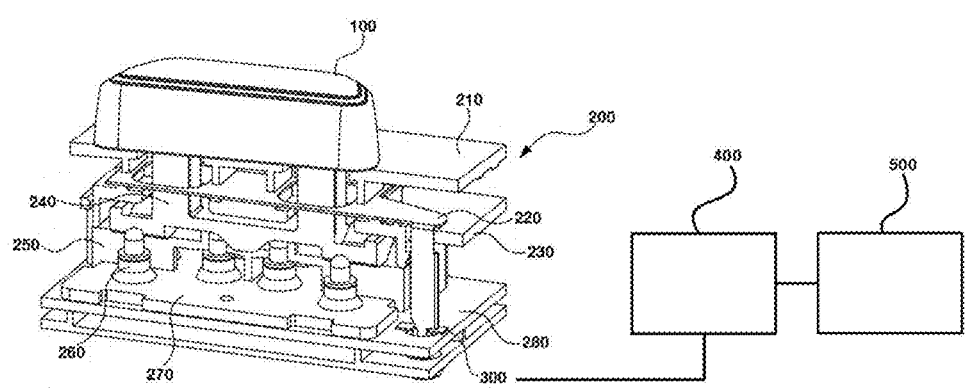
FIG. 1 is a perspective view showing the overall appearance of a capacitive touch-type power seat switch using a receptacle according to an embodiment of the present invention.
Figure 2:
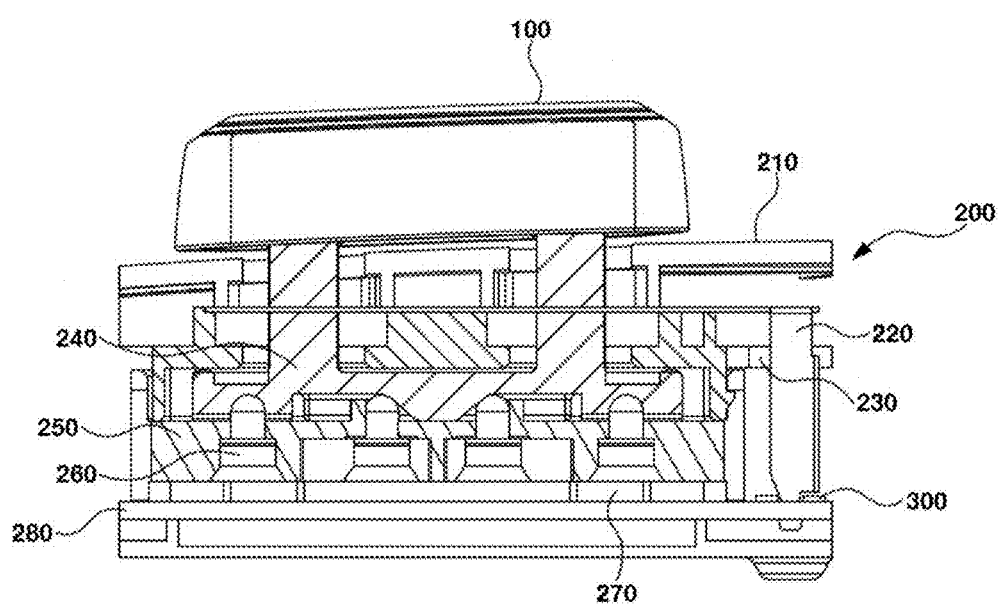
FIG. 2 is a front view showing the state in which the capacitive touch-type power seat switch using the receptacle in FIG. 1 is viewed from the front.
Figure 3:
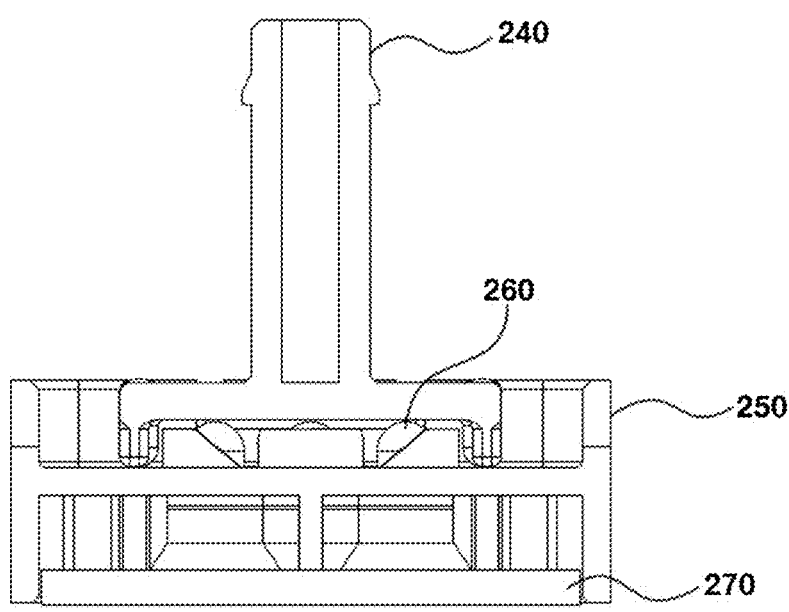
FIG. 3 is an exploded perspective view showing the state in which the capacitive touch-type power seat switch using the receptacle in FIG. 1 is disassembled.
Figure 4:
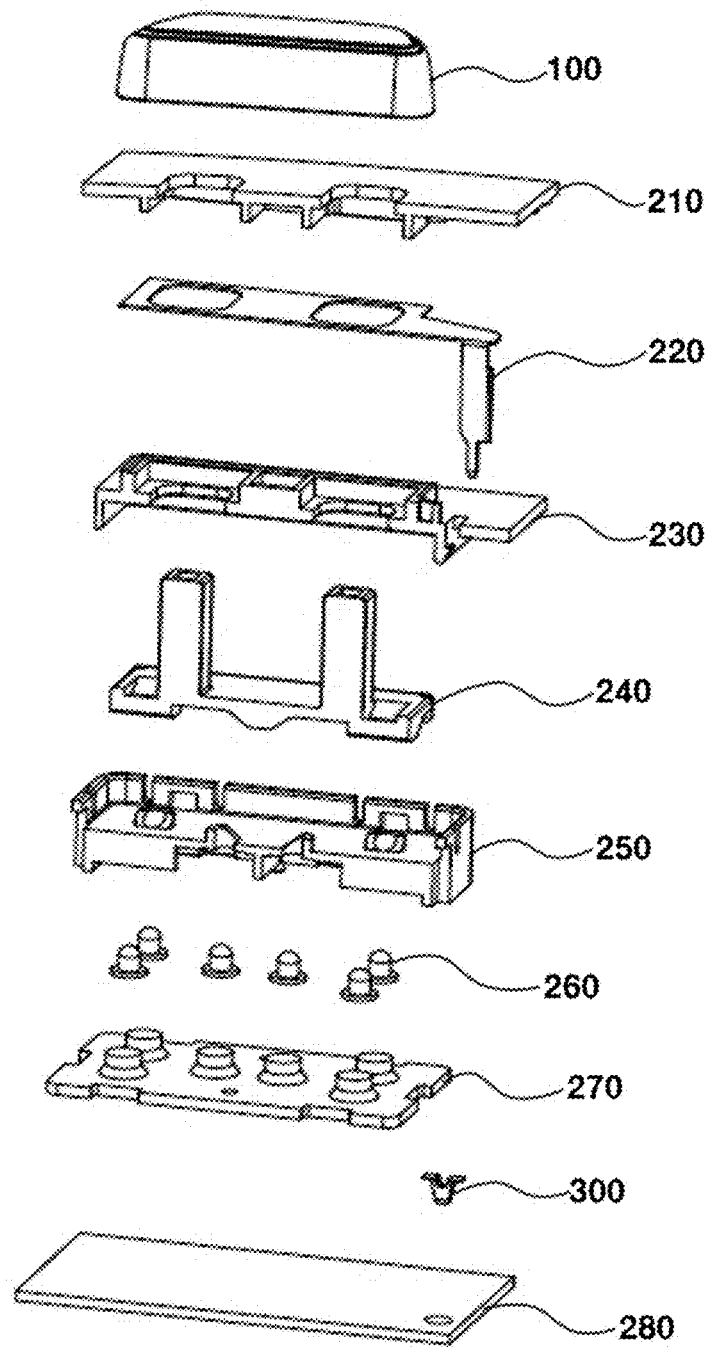
FIG. 4 is an enlarged view showing the enlarged coupling state of an upper cover, a slider, a plunger, and a lower cover of the capacitive touch-type power seat switch using the receptacle according to the embodiment of the present invention.
Figure 5:
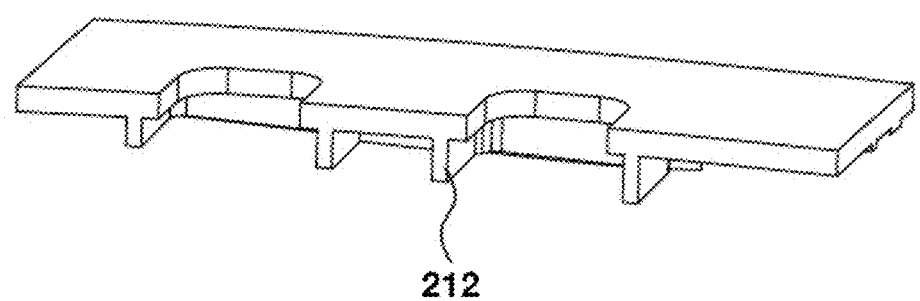
FIG. 5 is an enlarged view showing an enlarged power bezel.
Figure 6:
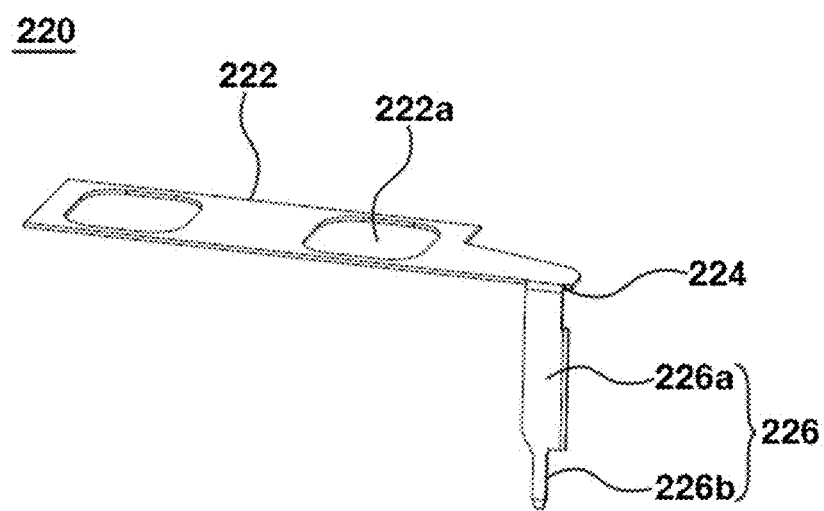
FIG. 6 is an enlarged view showing an enlarged stainless steel plate.
Figure 7:
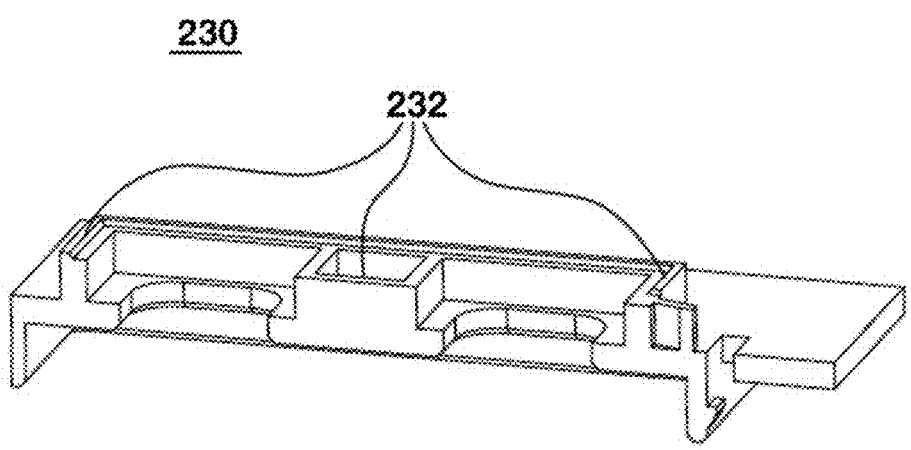
FIG. 7 is an enlarged view showing an enlarged upper cover.
Figure 8:
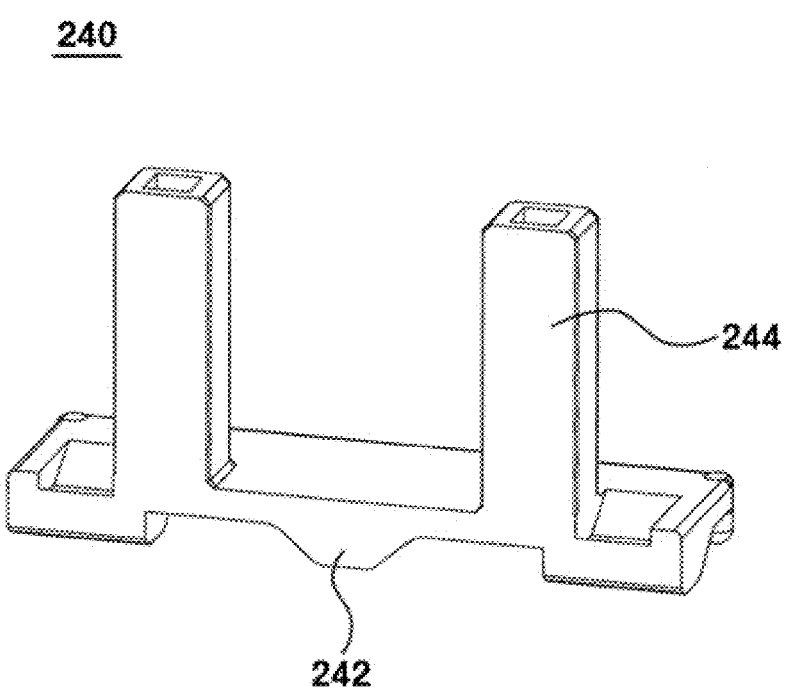
FIG. 8 is an enlarged view showing an enlarged slider.
Figure 9:
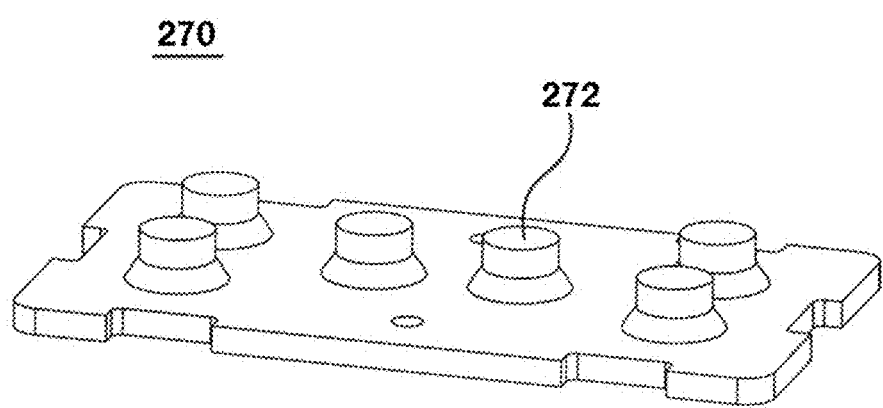
FIG. 9 is an enlarged view showing an enlarged elastic pad.
Figure 10:
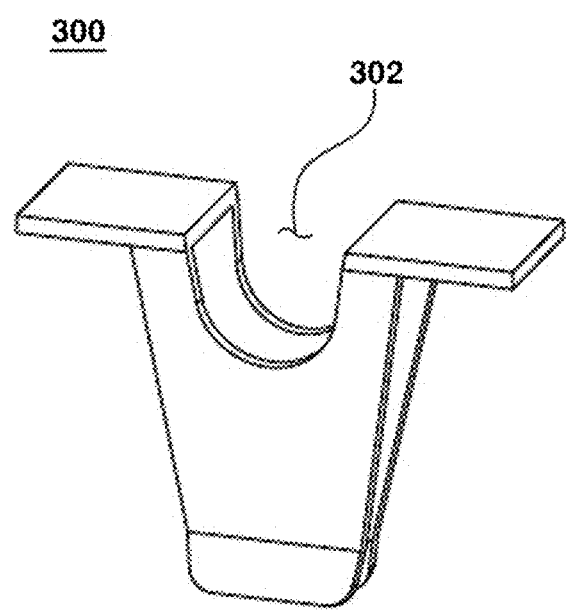
FIG. 10 is an enlarged view showing an enlarged receptacle.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes, will be determined in part by the particular intended application and use environment.

In the figures, reference numbers refer to the same or equivalent parts of the present invention throughout the several figures of the drawing.

DETAILED DESCRIPTION

Prior to describing embodiments of the present invention in detail, it should be noted that the embodiments of the present invention are provided to completely describe the present invention to those skilled in the art.

Accordingly, the claims of the present invention are not limited to the following embodiments and drawings.

In addition, the drawings in this specification are provided to enable a clear understanding of the description of the present invention with reference thereto, and thus some parts of the drawings may be exaggerated. Accordingly, there may be differences between the drawings shown in the present invention and an actual product.

Hereinafter, the present invention will be described with reference to the drawings. However, in order to describe the present invention briefly and clearly, an overview of a capacitive touch-type power seat switch using a receptacle will be given with reference to FIG. 1, and the components of the capacitive touch-type power seat switch using the receptacle will be described in detail with reference to FIGS. 2 to 10.

FIG. 1 is a perspective view of the capacitive touch-type power seat switch using the receptacle according to the embodiment of the present invention.

The capacitive touch-type power seat switch using the receptacle according to the embodiment of the present invention may be provided on a seat of a vehicle in order to control a position of the seat and a function thereof.

In addition, the capacitive touch-type power seat switch using the receptacle may enable the operation state of a power seat switch to be visually checked by outputting a detection signal corresponding to a change in capacitance to an AVN of a vehicle. Accordingly, in the dark, it is possible to confirm the switch that a user intends to operate.

Further, a sensor electrode 400 detects variation in capacitance that occurs when a human body or a specific object is located within a predetermined distance, and a sensor circuit part 500 connected to the sensor electrode 400 compares a detected variable capacitance value with a reference capacitance value. Here, when the variable capacitance value is equal to or greater than the reference capacitance value, the detection signal is output and transmitted to the AVN of the vehicle, thereby making it possible to confirm, in advance, the switch that a user intends to operate before the user directly touches the power seat switch.

The capacitive touch-type power seat switch using the receptacle includes a knob 100, an operation transmission unit 200, a receptacle 300, the sensor electrode 400, and the sensor circuit part 500. Here, the operation transmission unit 200 includes a power bezel 210, a stainless steel plate 220, an upper cover 230, a slider 240, a lower cover 250, a plunger 260, an elastic pad 270, and a PCB 280.

Hereinafter, components forming the capacitive touch-type power seat switch using the receptacle will be described in detail with reference to FIGS. 2 to 10.

The knob 100 may be disposed on the outermost side of the power seat switch so as to be operated by a user. The knob 100 is the only externally exposed element that the user is capable of operating. That is, since the user may control a position of a seat and a function thereof by operating the knob 100, the knob 100 is an operation element substantially configured to allow the user to operate the power seat switch.

The power bezel 210 may be installed below the knob 100. The power bezel 210 may form the exterior of the power seat switch together with the knob 100. That is, the knob 100 and the power bezel 210 are components that are visual to a user.

The power bezel 210 may prevent foreign substances from being introduced into components to be described later.

In addition, the stainless steel plate 220 to be described later may be fixed by the power bezel 210.

The power bezel 210 may be formed with a pressing part 212 configured to press the stainless steel plate 220 and fix the same. The pressing part 212 is formed at the lower portion of the power bezel 210, and presses the stainless steel plate 220 installed at the lower portion of the pressing part 212 downwards, thereby interacting with a support part 232 of the upper cover 230 to be described later. Accordingly, it is possible to prevent the stainless steel plate 220 from moving from the installed position thereof.

Therefore, when external force acts on the stainless steel plate 220 or the stainless steel plate 220 is used for a long period of time, the same does not deviate from the installation position thereof, thereby making it possible for the stainless steel plate 220 to perform the original function thereof.

Additionally, the pressing part 212 may be formed to minimize a contact area with the stainless steel plate 220.

Further, the power bezel 210 may be formed with one side thereof open so that an operation lever 244 of the slider 240, to be described later, may be coupled to the knob 100 installed at the upper portion of the power seat switch. Accordingly, the operation lever 244 to be described later may pass through an open portion of the power bezel 210 and may be coupled to the knob 100 installed at the upper portion thereof.

The stainless steel plate 220 may be installed below the power bezel 210. The stainless steel plate 220 may detect the user's body approaching the knob 100.

The stainless steel plate 220 may be formed of a metal plate or a stainless plate made of a conductive material. The stainless steel plate 220 may be formed of a conductor to detect the user's body approaching the same, and the sensor electrode to be described later may detect variation in capacitance.

The stainless steel plate 220 may sense a non-contact capacitance touch when the user's body or a specific object approaches the same within a radius of 30 mm thereof. That is, when the user's finger approaches the stainless steel plate 220 within a radius of 30 mm, the stainless steel plate 220 may detect the approach of the user's finger by sensing static electricity generated from the fingertip of the user. Accordingly, the stainless steel plate 220 may be an element that senses the non-contact capacitive touch.

The stainless steel plate 220 may be formed of an upper plate 222 and a bent end 226.

A pair of through-holes 222a, through which a pair of operation levers 244 of the slider 240 to be described later may pass, may be formed in the upper plate 222. Accordingly, the knob 100 and the operation levers 244 may be easily coupled to each other.

The upper plate 222 may also be formed to have an area corresponding to a threshold value set to implement target touch sensitivity.

An extension part 224 may be formed at one end of the upper plate 222.

The extension part 224 may allow the bent end 226 to be described later to be spaced apart from one end of the upper plate 222 by a predetermined distance and to be bent downwards.

The bent end 226 bent downwards may be formed on one side of the extension part 224. That is, the bent end 226 extends downwards, and is coupled to the receptacle 300 installed on the PCB 280 to be described later. Accordingly, the same is directly coupled to the receptacle 300 without passing through other components to be described later, and as such, the sensor electrode to be described later may detect variation in capacitance.

The bent end 226 may be bent into a shape corresponding to one end of the upper cover 230, to be described later. That is, the bent end 226 is not bent directly downwards from the upper plate 222. Specifically, the bent end 226 is bent downwards from the extension part 224 configured to extend from one side of the upper plate 222 to the right side in the drawing by a predetermined distance so as to correspond to the shape of the upper cover 230. Accordingly, the bent end 226 is formed to be easily manufactured in the manufacturing process, and is assembled to a support structure inside the upper cover 230.

Further, the bent end 226 may be formed of an upper surface part 226a having a large width and a connection part 226b having a small width.

The upper surface part 226a may be formed such that the thickness thereof is increased by forming the same to be larger or by additionally bending the same in order to prevent damage thereto, such as bending of the bent end 226 while the vehicle is being driven. Accordingly, the stainless steel plate 220 may perform the original function thereof by preventing the above-mentioned damage.

The connection part 226b may be formed to have a small width. Since the connection part 226b is formed to have a width narrower than the width of the upper surface part 226a, the same may be easily coupled into an accommodation groove 302 in the receptacle 300 to be described later.

The upper cover 230 may be installed below the stainless steel plate 220.

The support part 232 may be formed upwards on the upper cover 230. The stainless steel plate 220 may be supported by the support part 232.

In addition, the support part 232 may interact with the pressing part 212 of the power bezel 210 to prevent movement of the stainless steel plate 220.

Therefore, when external force acts on the stainless steel plate 220 or the stainless steel plate 220 is used for a long period of time, the same does not deviate from the installation position thereof, thereby making it possible to perform the original function of the stainless steel plate 220.

Further, one side of the upper cover 230 may be formed to be open so that the operation lever 244 of the slider 240, which will be described later, is coupled to the knob 100 installed at the upper portion of the power seat switch. Accordingly, the operation lever 244 to be described later may pass through the open portion of the power bezel 210 and may be coupled to the knob 100 installed at the upper portion thereof.

The upper cover 230 may serve as a protective cover to protect components to be described later from foreign substances introduced from the outside.

The slider 240 may be installed below the upper cover 230. The slider 240 may be coupled to the knob 100. The slider 240 may allow the knob 100 to move upwards, downwards, leftwards, and rightwards. Accordingly, the slider 240 and the knob 100 move in a state of being coupled to each other, thereby adjusting the position of a seat and the angle thereof.

The slider 240 may be formed of a bottom plate 242 formed by cutting the lower portion thereof in a V-shape and a pair of operation levers 244 formed to be spaced apart from each other by a predetermined gap, the pair of operation levers 244 being located at the upper portion of the bottom plate 242. The V-cut bottom plate 242 may be formed so as to be in close contact with a plunger 260 to be described later. The operation lever 244 may pass through the stainless steel plate 220 and the power bezel 210 to be coupled to the uppermost knob 100.

The lower cover 250 may be installed below the slider 240. The lower cover 250 may be coupled to the upper cover 230. The lower cover 250 may form space in which the slider 240 is capable of sliding. That is, the lower cover 250 may be formed to be wider than the circumference of the slider 240 in order to secure space in which the slider 240 is capable of moving in the lower cover 250.

A plurality of coupling holes may be formed in the bottom surface of the lower cover 250. Here, each of the plungers 260 to be described later may be coupled to the lower cover 250 through a corresponding one of the plurality of coupling holes, and may protrude therethrough. Accordingly, the plurality of plungers 260 may be appropriately coupled to the lower cover 250 at respective designated positions.

The plurality of plungers 260 may be installed below the lower cover 250.

The plurality of plungers 260 may detect the operation direction of the knob 100 by the movement of the slider 240. That is, the slider 240 may be moved by the operation of the knob 100, thereby pressing the plungers 260 installed at respective positions. Accordingly, the plurality of plungers 260 at pressed points transmit the operation direction thereof to the elastic pad 270 to be described later as a pressure signal, thereby making it possible to detect the direction of operation of the knob 100 by a user.

The elastic pad 270 may be installed below the plurality of plungers 260. A plurality of contact parts 272 may be formed on the elastic pad 270. The plurality of plungers 260 may be disposed above respective ones of the plurality of contact parts 272. That is, the plurality of coupling holes in the lower cover 250, the plurality of plungers 260, and the plurality of contact parts 272 may be formed to be located along the same line in the vertical direction.

Therefore, each of the contact parts 272 installed on the elastic pad 270 receives a pressure signal indicating the operation direction of the knob 100 from a corresponding one of the plurality of plungers 260 pressed by the slider 240, and the received pressure signal may be transmitted as an operation signal to the PCB 280 to be described later.

In addition, the elastic pad 270 may easily return the plungers 260 to the original positions thereof by applying a material and a curtain structure corresponding to a target operation force thereto. Accordingly, the plunger 260 may perform the original function thereof when the same is used for a long period of time.

The PCB 280 may be installed below the elastic pad 270. The PCB 280 may be a general single-sided PCB, a double-sided PCB, or the like.

The PCB 280 may have a groove formed therein, the groove having the receptacle 300 to be described later mounted therein.

The receptacle 300 may be installed in the PCB 280. The receptacle 300 may be mounted in the PCB 280 to be installed therein.

The receptacle 300 may have the accommodation groove 302 formed therein.

The accommodation groove 302 may be formed by vertically penetrating the middle portion of the receptacle 300 so that the connection part 226b is capable of being inserted therethrough.

The bent end 226 of the stainless steel plate 220 may be inserted into and coupled to the accommodation groove 302 formed in the receptacle 300. That is, the stainless steel plate 220 may be directly coupled to the receptacle 300 without passing through other components.

In addition, the connection part 226b of the bent end 226 is inserted into the accommodation groove 302 in the receptacle 300, thereby making it possible to prevent the bent end 226 of the stainless steel plate 220 from becoming separated from the PCB 280.

The sensor electrode (not shown) may be electrically connected to and installed in the receptacle 300. The sensor electrode may be a chip coupled to the PCB 280 by soldering.

The sensor electrode may detect variation in capacitance, and may input a detected variable capacitance value to the sensor circuit part to be described later.

The sensor electrode may input the variable capacitance value to the sensor circuit part to be described later.

The sensor circuit part (not shown) may be electrically connected to the sensor electrode.

The sensor circuit part may output a detection signal through the variable capacitance value input from the sensor electrode.

A comparator may be provided in the sensor circuit part. The comparator may detect a change in capacitance and output the detection signal.

The reference capacitance value may be input to one side of the comparator, and the variable capacitance value input from the sensor electrode may be input to the other side thereof.

The comparator may compare the variable capacitance value input from the sensor electrode with the reference capacitance value. That is, when the comparator determines, through a comparison operation thereof, that the input variable capacitance value is equal to or greater than the reference capacitance value, the same may detect that the user's body has been in contact with the power seat switch and may generate the detection signal to output the same.

Accordingly, the sensor circuit part may transmit the detection signal output from the comparator to an AVN of a vehicle, and may indicate which knob 100 is to be operated on a screen of the AVN.

Additionally, the PCB 280 may move a position of a seat of the vehicle, or may adjust an angle and a height of the seat in response to the operation signal received from the elastic pad 270.

That is, the PCB 280 may be a driving element configured to substantially implement the function of the power seat switch.

As is apparent from the above description, according to the present invention, an operation state of a power seat switch is output to an AVN of a vehicle, thereby making it possible to confirm which switch is operated by a user in the dark. Accordingly, convenience of operation of the power seat switch and accuracy of operation thereof may be improved.

Further, a sensor electrode detects variation in capacitance, which occurs when a human body or a specific object is located within a predetermined distance, and a sensor circuit part connected to the sensor electrode compares a detected variable capacitance value with a reference capacitance value. In this case, when the variable capacitance value is equal to or greater than the reference capacitance value, a detection signal is output and transmitted to the AVN of the vehicle, thereby making it possible to confirm, in advance, the switch that a user intends to operate before the user touches the power seat switch.

The embodiments of the present invention have been described with reference to the accompanying drawings. However, it will be appreciated by those skilled in the art that various alternatives, modifications, equivalents, and other embodiments may be made in these embodiments without departing from the principles and spirit of the invention, the scope of which is defined in the appended claims and equivalents thereto. Therefore, it will be understood that the embodiments described herein are illustrative in all respects and not limiting.

What is claimed is:

1. A power seat switch using a receptacle, mounted on a seat of a vehicle and configured to control a position of the seat and a function thereof, the power seat switch comprising:
   a knob configured to be moved upwards, downwards, leftwards, and rightwards by operation of a user;
   an operation transmission unit configured to transmit an operation direction of the knob when the knob is moved upwards, downwards, leftwards, and rightwards, and to implement a function of the power seat switch in response to an operation signal according to the transmitted operation direction;
   a receptacle installed in a PCB provided in the operation transmission unit;
   a sensor electrode electrically connected to the receptacle and configured to detect variation in capacitance; and
   a sensor circuit part electrically connected to the sensor electrode,
   wherein the operation transmission unit comprises:
   a power bezel installed below the knob, the power bezel having a pressing part formed thereon,
   a stainless steel plate made of a conductive material and installed below the power bezel,
   an upper cover installed below the stainless steel plate, the upper cover having a support part formed thereon,
   a slider installed below the upper cover and coupled to the knob to allow the knob to move upwards, downwards, leftwards, and rightwards,
   a lower cover installed below the slider and coupled to the upper cover to form a space configured to enable the slider to slide therein,
   a plurality of plungers installed below the lower cover and configured to transmit the operation direction of the knob by movement of the slider, and
   an elastic pad installed below the plurality of plungers and configured to transmit the operation direction of the knob transmitted by vertical movement of the plurality of plungers in a form of contact connection.

2. The power seat switch of claim 1, wherein:
   the stainless steel plate comprises an upper plate having a pair of through-holes formed therein, an extension part formed at one end of the upper plate, and a bent end bent downwards from one side of the extension part, and
   the bent end comprises an upper surface part having a large width and a connection part having a small width.

3. The power seat switch of claim 1, wherein the stainless steel plate is installed between the pressing part of the power bezel and the support part of the upper cover, thereby allowing the sensor electrode to accurately detect a variable capacitance value.

4. The power seat switch of claim 1, wherein the slider comprises:
   a bottom plate formed by cutting a lower portion thereof in a V-shape so that the plurality of plungers are in close contact therewith, and
   a pair of operation levers formed to be spaced apart from each other by a predetermined gap and located at an upper portion of the bottom plate.

5. The power seat switch of claim 1, wherein:
   the sensor circuit part comprises a comparator configured to receive a reference capacitance value through one side thereof, and to receive a variable capacitance value from the sensor electrode through the other side thereof, and
   the comparator compares the variable capacitance value with the reference capacitance value and outputs a detection signal when the variable capacitance value is equal to or greater than the reference capacitance value.

* * * * *